(12) United States Patent
Mimura

(10) Patent No.: US 12,255,636 B2
(45) Date of Patent: *Mar. 18, 2025

(54) ACOUSTIC WAVE FILTER DEVICE

(71) Applicant: Murata Manufacturing Co., Ltd., Nagaokakyo (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 54 days.

This patent is subject to a terminal disclaimer.

(21) Appl. No.: 18/212,807

(22) Filed: Jun. 22, 2023

(65) Prior Publication Data

US 2023/0336160 A1    Oct. 19, 2023

Related U.S. Application Data

(63) Continuation of application No. 17/108,038, filed on Dec. 1, 2020, now Pat. No. 11,722,124, which is a continuation of application No. 16/855,195, filed on Apr. 22, 2020, now Pat. No. 10,892,739, which is a continuation of application No. 15/941,019, filed on Mar. 30, 2018, now Pat. No. 10,666,228, which is a continuation of application No. PCT/JP2016/073418, filed on Aug. 9, 2016.

(30) Foreign Application Priority Data

Oct. 23, 2015    (JP) .................................. 2015-208925

(51) Int. Cl.
*H03H 9/64*    (2006.01)
*H03H 9/02*    (2006.01)
*H03H 9/145*    (2006.01)
*H03H 9/25*    (2006.01)

(52) U.S. Cl.
CPC ...... *H03H 9/6489* (2013.01); *H03H 9/02559* (2013.01); *H03H 9/02637* (2013.01); *H03H 9/145* (2013.01); *H03H 9/14541* (2013.01); *H03H 9/25* (2013.01); *H03H 9/6436* (2013.01); *H03H 9/6483* (2013.01)

(58) Field of Classification Search
CPC ............ H03H 9/6489; H03H 9/02559; H03H 9/02637; H03H 9/145; H03H 9/14541; H03H 9/25; H03H 9/6436; H03H 9/6483
USPC ......................................... 333/133, 193–196
See application file for complete search history.

(56) References Cited

U.S. PATENT DOCUMENTS

| 10,666,228 | B2 * | 5/2020 | Mimura | ............... | H03H 9/6489 |
| 10,892,739 | B2 * | 1/2021 | Mimura | ............ | H03H 9/14541 |
| 11,722,124 | B2 * | 8/2023 | Mimura | ............ | H03H 9/02637 |
| | | | | | 333/194 |

(Continued)

OTHER PUBLICATIONS

Mimura, "Acoustic Wave Filter Device", U.S. Appl. No. 17/108,038, filed Dec. 1, 2020.

*Primary Examiner* — Jorge L Salazar, Jr.
(74) *Attorney, Agent, or Firm* — Keating & Bennett, LLP

(57) ABSTRACT

A bandpass acoustic wave filter device includes an IDT electrode and a dielectric film disposed on a piezoelectric substrate including a $LiNbO_3$ layer, and an acoustic wave resonator is defined by the IDT electrode. The acoustic wave resonator utilizes the Rayleigh wave, and a response of an SH wave excited by the acoustic wave resonator is outside a pass band of the acoustic wave filter device.

8 Claims, 10 Drawing Sheets

(56) References Cited

U.S. PATENT DOCUMENTS

2013/0285504 A1\* 10/2013 Tamasaki ............. H03H 9/6483
310/313 C

\* cited by examiner

ACOUSTIC WAVE FILTER DEVICE

CROSS REFERENCE TO RELATED APPLICATIONS

This application claims the benefit of priority to Japanese Patent Application No. 2015-208925 filed on Oct. 23, 2015 and is a Continuation Application of PCT Application No. PCT/JP2016/073418 filed on Aug. 9, 2016. The entire contents of each application are hereby incorporated herein by reference.

BACKGROUND OF THE INVENTION

1. Field of the Invention

The present invention relates to a bandpass acoustic wave filter device, which utilizes a Rayleigh wave.

2. Description of the Related Art

WO2007/125733 discloses an acoustic wave resonator utilizing a Rayleigh wave. In the acoustic wave resonator disclosed in WO2007/125733, an IDT (interdigital transducer) electrode is provided on a $LiNbO_3$ substrate. A $SiO_2$ film is laminated on the $LiNbO_3$ substrate and covers the IDT electrode. WO2007/125733 states that an SH wave spurious appearing between a resonant frequency and an anti-resonant frequency is able to be suppressed by adjusting Euler Angles of the $LiNbO_3$ substrate and a film thickness of the IDT electrode.

However, WO2007/125733 merely refers to the suppression of the SH wave spurious appearing between the resonant frequency and the anti-resonant frequency in the acoustic wave resonator.

Meanwhile, in a bandpass filter including acoustic wave resonators, because the plurality of acoustic wave resonators are employed, even when the SH wave spurious appearing between the resonant frequency and the anti-resonant frequency is merely suppressed in each of the acoustic wave resonators, there is a possibility that the SH wave spurious may generate in a pass band of the filter.

SUMMARY OF THE INVENTION

Preferred embodiments of the present invention provide bandpass acoustic wave filter devices, which utilize a Rayleigh wave and which are less affected by an SH wave response.

A preferred embodiment of the present invention provides a bandpass acoustic wave filter device, which includes a plurality of acoustic wave resonators each including a piezoelectric substrate including a $LiNbO_3$ layer, an IDT electrode disposed on the $LiNbO_3$ layer, and a dielectric film disposed on the piezoelectric substrate and covering the IDT electrode, wherein the acoustic wave resonators utilize a Rayleigh wave, and a response of an SH wave excited by one or more of the acoustic wave resonators utilizing the Rayleigh wave is outside a pass band of the acoustic wave filter device.

In an acoustic wave filter device according to a preferred embodiment of the present invention, the SH wave response is on the lower frequency side than the pass band of the acoustic wave filter device. In this case, since the SH wave response is on the lower frequency side than the pass band, an influence of the SH wave response in the pass band is able to be eliminated or substantially eliminated.

In an acoustic wave filter device according to a preferred embodiment of the present invention, the IDT electrode includes a main electrode layer that is made of a material having a density of not smaller than about 18 $g/cm^3$, and a thickness of the main electrode layer is has a value at which an acoustic velocity of the SH wave is slower than an acoustic velocity of the Rayleigh wave by about 2% or more. In this case, the SH wave response is located farther away from the pass band.

In an acoustic wave filter device according to a preferred embodiment of the present invention, the main electrode layer is made of Pt or an alloy including Pt as a main ingredient, and the thickness of the main electrode layer is not smaller than about 0.061λ. In this case, the acoustic velocity of the SH wave is able to be reliably made slower than that of the Rayleigh wave by about 2% or more.

In an acoustic wave filter device according to a preferred embodiment of the present invention, the thickness of the main electrode layer is in a range of not smaller than about 0.061λ and not larger than about 0.20λ.

In an acoustic wave filter device according to a preferred embodiment of the present invention, the main electrode layer is made of W or an alloy including W as a main ingredient, and the thickness of the main electrode layer is not smaller than about 0.090λ. In this case, the acoustic velocity of the SH wave is able to be reliably made slower than that of the Rayleigh wave by about 2% or more.

In an acoustic wave filter device according to a preferred embodiment of the present invention, the thickness of the main electrode layer is in a range of not smaller than about 0.090λ and not larger than about 0.20λ.

In an acoustic wave filter device according to a preferred embodiment of the present invention, the piezoelectric substrate has Euler Angles (0°±within range of about 5°, θ, 0°±within range of about 10°), θ being in a range of not smaller than about 20° and not larger than about 50°. In this case, the Rayleigh wave is able to be efficiently excited.

In an acoustic wave filter device according to a preferred embodiment of the present invention, the bandpass acoustic wave filter device is a ladder filter including a serial arm resonator and a parallel arm resonator, and the acoustic wave resonator defines the serial arm resonator. In this case, the influence of the SH wave response in a pass band of the ladder filter is able to be more reliably reduced or prevented.

In an acoustic wave filter device according to a preferred embodiment of the present invention, the acoustic wave resonator is a resonator for a series-connected trap.

In acoustic wave filter devices according to preferred embodiments of the present invention, the SH wave response is set outside the pass band. Therefore, the acoustic wave filter devices which is less affected by SH wave spurious responses are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified from the following description of examples of preferred embodiments of the present invention with reference to the drawings.

It is to be noted that the preferred embodiments described herein are merely illustrative, and individual elements may be partially replaced or combined with each other between the different preferred embodiments.

Figure 1:
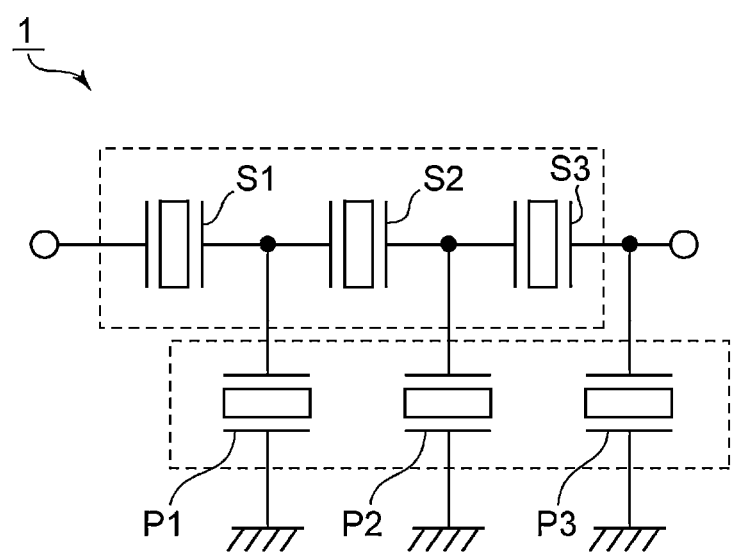
FIG. 1 is a circuit diagram of an acoustic wave filter device according to a preferred embodiment of the present invention.

FIG. 1 is a circuit diagram of a ladder filter as an acoustic wave filter device according to one preferred embodiment of the present invention.

The acoustic wave filter device 1 includes a serial arm interconnecting an input terminal and an output terminal. In the serial arm, serial arm resonators S1 to S3 are successively connected in series.

A parallel arm resonator P1 is disposed in a parallel arm interconnecting a junction point between the serial arm resonators S1 and S2 and a ground potential. A parallel arm resonator P2 is disposed in a parallel arm interconnecting a junction point between the serial arm resonators S2 and S3 and the ground potential. A parallel arm resonator P3 is disposed between an output terminal of the serial arm resonator S3 and the ground potential.

Preferably, the serial arm resonators S1 to S3 and the parallel arm resonators P1 to P3 are each a 1-port acoustic wave resonator, for example.

In the bandpass acoustic wave filter device 1, as known in the art, attenuation poles on both sides of a pass band are present at an anti-resonant frequency of the serial arm resonators S1 to S3 and a resonant frequency of the parallel arm resonators P1 to P3. According to the acoustic wave filter device 1, in the acoustic wave resonators defining the serial arm resonators S1 to S3 and the parallel arm resonators P1 to P3, an SH wave response preferably is set outside a pass band of the acoustic wave filter device 1. Therefore, the acoustic wave filter device is less affected by an SH wave spurious response. In other words, filter characteristics in the pass band are improved. That point will be described in detail below with reference to FIGS. 2A and 2B to 14.

Figure 2A:
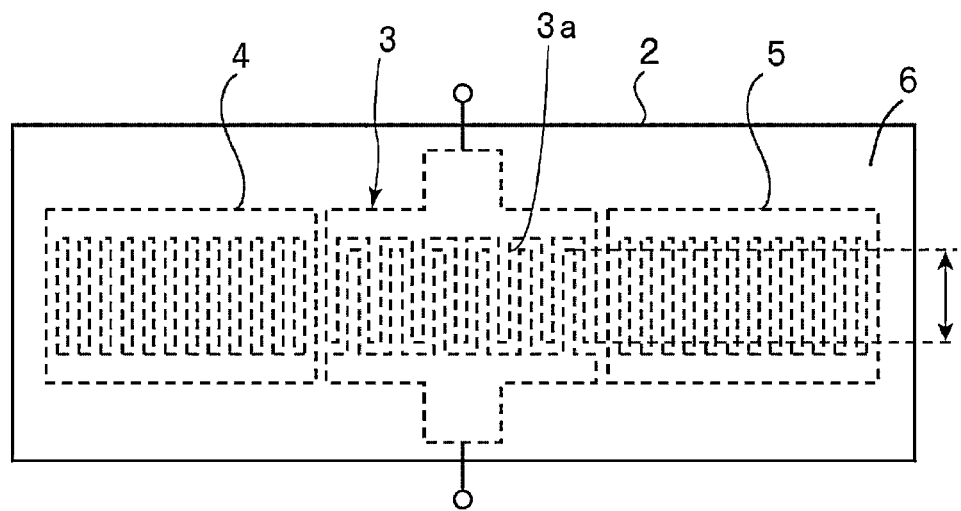
FIG. 2A is a schematic plan view referenced to explain a configuration of one acoustic wave resonator in an acoustic wave filter device according to a preferred embodiment of the present invention.

FIG. 2A is a schematic plan view of an acoustic wave resonator used as the serial arm resonator S1.

The acoustic wave filter device 1 includes a LiNbO$_3$ substrate 2. An IDT (interdigital transducer) electrode 3 is disposed on the LiNbO$_3$ substrate 2. The IDT electrode 3 includes a plurality of electrode fingers 3a. Reflectors 4 and 5 are disposed on both sides of the IDT electrode 3 in a propagation direction of an acoustic wave. Thus, a 1-port acoustic wave resonator is defined. The acoustic wave filter device 1 utilizes a Rayleigh wave.

In the acoustic wave filter device 1, a dielectric film 6 is disposed on the LiNbO$_3$ substrate 2 and covers the IDT electrode 3. In the present preferred embodiment, the dielectric film 6 is preferably made of SiO$_2$, for example. Preferably, a thickness of the dielectric film 6 is larger than that of the IDT electrode 3, and it is set to be not larger than about 0.5λ, for example. Furthermore, though not illustrated, a frequency adjustment film preferably made of SiN, for example, may be disposed on the dielectric film 6.

Figure 2B:
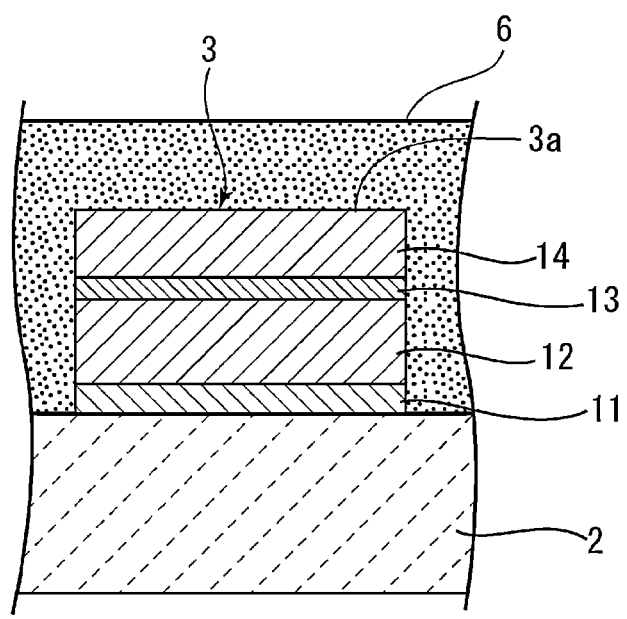
FIG. 2B is an enlarged front sectional view illustrating an electrode structure.

The IDT electrode 3 includes a main electrode layer that is preferably made of a material having a density of not smaller than about 18 g/cm$^3$, for example. In the present preferred embodiment, as illustrated in FIG. 2B, the IDT electrode 3 is defined by a multilayer metal film including a close contact layer 11, a main electrode layer 12, a diffusion preventive layer 13, and a low-resistance layer 14.

The close contact layer 11 is preferably made of an appropriate material, such as NiCr, for example, which has higher adhesion to LiNbO$_3$ substrate 2 than the main electrode layer 12. The main electrode layer 12 is preferably made of the material having the density of not smaller than about 18 g/cm$^3$, for example. That material is, for example, Pt, W, or an alloy including such a metal as a main ingredient. The phrase "main ingredient of the alloy" means an ingredient that is included at a rate of more than about 50% by weight in terms of average density of an alloy composition. The phrase "main electrode layer" means an electrode layer that has a dominant role to excite a Rayleigh wave such that a Rayleigh wave response is able to be utilized when the electrode is disposed on the LiNbO$_3$ substrate.

In a preferred embodiment of the present invention, the IDT electrode 3 may be defined by only the main electrode layer that is preferably made of the material having the density of not smaller than about 18 g/cm³, for example. In other words, the IDT electrode 3 may be defined by a single electrode layer. Preferably, a thickness of the main electrode layer is set to a value at which an acoustic velocity of an SH wave is slower than that of a Rayleigh wave by about 2% or more, for example. With such a feature, the SH wave response is able to be more reliably set in a frequency range outside the pass band.

The term "SH wave response" means a resonance phenomenon caused by the SH wave and represents resonance characteristics in a frequency range including both a resonant frequency and an anti-resonant frequency. The term "acoustic velocity" means a value equal to the product of a frequency and a wavelength that is determined by the pitch of the electrode fingers in the IDT electrode 3.

The wavelength determined depending on the pitch of the electrode fingers in the IDT electrode 3 is denoted by $\lambda$. When the main electrode layer is made of Pt or an alloy including Pt as a main ingredient, the thickness of the main electrode layer 12 is preferably not smaller than about $0.061\lambda$, for example, and more preferably in a range of not smaller than about $0.061\lambda$ and not larger than about $0.20\lambda$, for example. In this case, the acoustic velocity of the SH wave is able to be more effectively made slower than that of the Rayleigh wave.

As an alternative, preferably, the main electrode layer 12 is made of W or an alloy including W as a main ingredient, for example, and the thickness of the main electrode layer 12 is preferably not smaller than about $0.090\lambda$, for example, and more preferably in a range of not smaller than about $0.090\lambda$ and not larger than about $0.20\lambda$, for example. In this case, the acoustic velocity of the SH wave is able to be more reliably made slower than that of the Rayleigh wave by about 2% or more, for example.

In the IDT electrode 3, the diffusion preventive layer 13 prevents diffusion of metal between the main electrode layer 12 and the low-resistance layer 14. A material of the diffusion preventive layer 13 is preferably Ti, for example.

The low-resistance layer 14 reduces electrical resistance of the IDT electrode 3. The low-resistance layer 14 is preferably made of a metal having higher electrical conductivity than the main electrode layer 12. When the main electrode layer 12 is made of Pt or W, for example, the low-resistance layer 14 may preferably be made of Ag or Al, for example. A thickness of the low-resistance layer 14 is selected as appropriate depending on a required value of the electrical resistance, and may preferably be set to a value of about $0.03\lambda$ to about $0.15\lambda$, for example.

Although the acoustic wave resonator defining the serial arm resonator S1 has been described above, any one or more of the serial arm resonators S2 and S3 and the parallel arm resonators P1 to P3 may be an acoustic wave resonator similar to the above-described one. In other words, the thickness of the main electrode layer in one or more of both the serial arm resonators and the parallel arm resonators in the acoustic wave filter device 1, which is the ladder filter, is preferably set to a value at which the acoustic velocity of the SH wave generated in the relevant resonator is slower than that of the Rayleigh wave by about 2% or more, for example. In more detail, when the main electrode layer of the relevant resonator is made of Pt or the alloy including Pt as the main ingredient, the thickness of the main electrode layer is preferably in the range of not smaller than about $0.061\lambda$ and not larger than about $0.20\lambda$, for example. Alternatively, when the main electrode layer of the relevant resonator is made of W or the alloy including W as the main ingredient, the thickness of the main electrode layer is preferably in the range of not smaller than about $0.090\lambda$ and not larger than about $0.20\lambda$, for example.

It is to be noted that parameters, such as pitches and intersecting widths of the electrode fingers of the IDT electrodes, in the serial arm resonators S1 to S3 and the parallel arm resonators P1 to P3 are not required to be the same and may be selected as appropriate depending on the desired filter characteristics.

In the acoustic wave filter device 1, at least one of the above-described acoustic wave resonators utilizes the Rayleigh wave, and the response of the SH wave excited by the relevant acoustic wave resonator is set outside the pass band of the acoustic wave filter device 1. As a result, the filter characteristics of the acoustic wave filter device are less affected by the SH wave.

More preferably, the SH wave response is set on the lower frequency side than the pass band of the acoustic wave filter device 1. In this case, the filter characteristics of the acoustic wave filter device are even less affected by the SH wave response. This point will be described below with reference to FIGS. 3 to 4.

Figure 3:
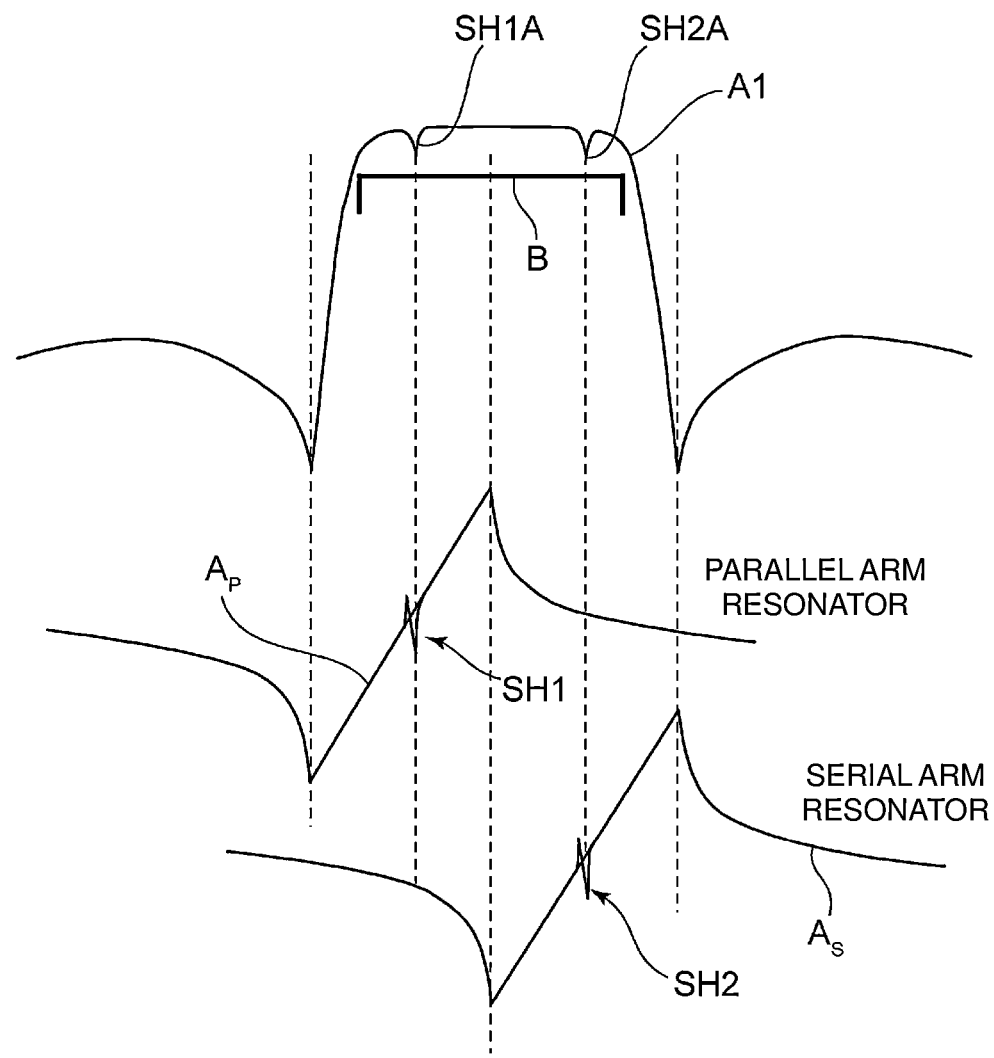
FIG. 3 is an illustration representing relationships between filter characteristics and impedance characteristics of each of a parallel arm resonator and a serial arm resonator in a ladder filter of the related art.

FIG. 3 is an illustration representing relationships between filter characteristics and impedance characteristics of each of a parallel arm resonator and a serial arm resonator in a ladder filter, which is an example of related-art acoustic wave filter devices.

A solid line A1 denotes the filter characteristics of the ladder filter, a solid line $A_P$ denotes the impedance characteristics of the parallel arm resonator, and a solid line $A_S$ denotes the impedance characteristics of the serial arm resonator. As shown in FIG. 3, attenuation poles are provided at locations outside a pass band B of the latter filter at a resonant frequency in the impedance characteristics of the parallel arm resonator and an anti-resonant frequency of the serial arm resonator.

In the impedance characteristics $A_P$ of the parallel arm resonator, the SH wave response, denoted by an arrow SH1, appears as a spurious response between the resonant frequency and the anti-resonant frequency. Similarly, in the impedance characteristics $A_S$ of the serial arm resonator, an SH wave spurious response appears between the resonant frequency and the anti-resonant frequency as denoted by an arrow SH2. In this case, corresponding to the spurious responses SH1 and SH2, spurious responses SH1A and SH2A are present in the filter characteristics of the ladder filter within the pass band thereof.

Thus, when the SH wave response is generated between the resonant frequency and the anti-resonant frequency of the acoustic wave resonator, the spurious responses SH1A and SH2A are present within the pass band B of the ladder filter, and the filter characteristics are degraded.

Figure 4:
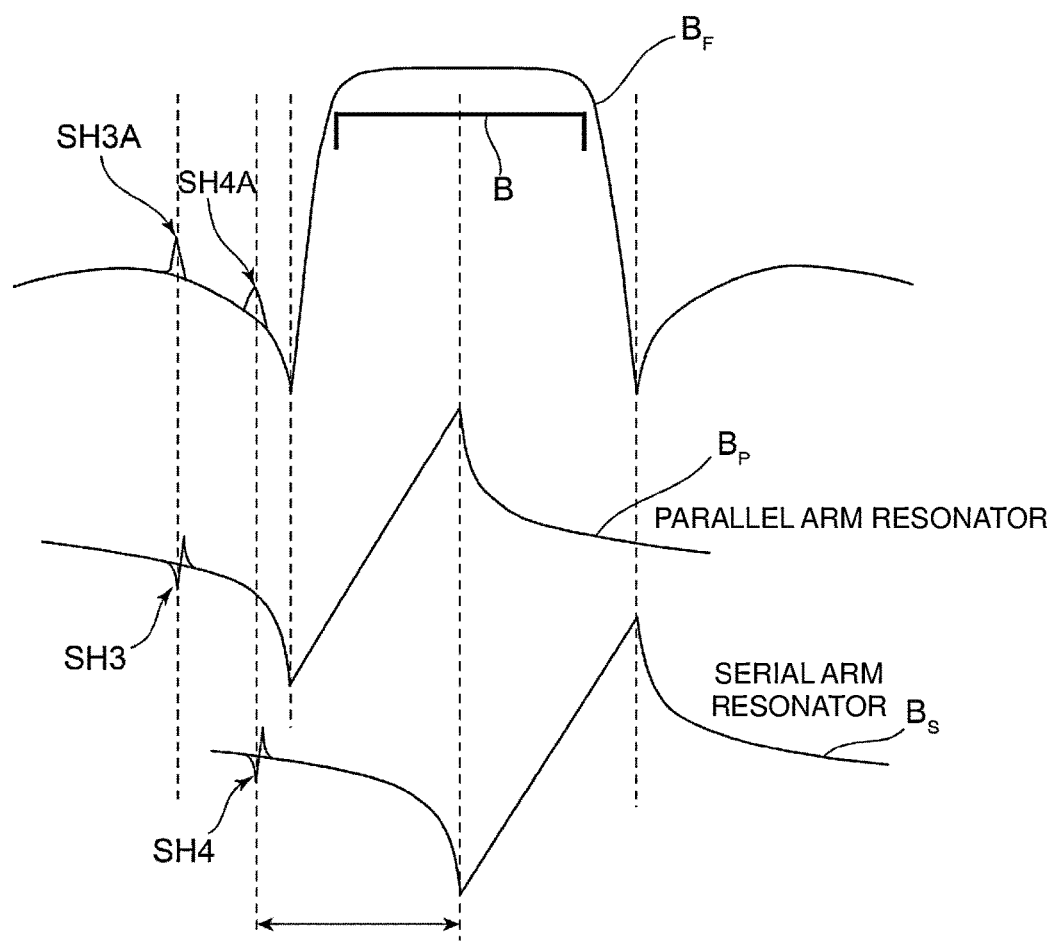
FIG. 4 is an illustration representing relationships between impedance characteristics of each of a parallel arm resonator and a serial arm resonator and filter characteristics of a ladder filter in a preferred embodiment of the present invention.

On the other hand, in the acoustic wave filter device 1 according to the present preferred embodiment, as illustrated in FIG. 4, the SH wave response is present in each of impedance characteristics $B_P$ of the parallel arm resonator and impedance characteristics $B_S$ of the serial arm resonator at a location lower than the resonant frequency. More specifically, in the impedance characteristics $B_P$, the SH wave response, denoted by an arrow SH3, is present in a frequency range lower than the resonant frequency. Also in the impedance characteristics $B_S$ of the serial arm resonator, the SH wave response, denoted by an arrow SH4, is present in a frequency range sufficiently lower than the resonant frequency. Frequencies of the SH wave responses SH3 and SH4 are both located in a frequency range lower than the resonant frequency of the parallel arm resonator.

Accordingly, in filter characteristics $B_F$ of the acoustic wave filter device 1, the SH wave spurious responses are present at locations denoted by arrows SH3A and SH4A. In other words, the spurious responses SH3A and SH4A are present in the frequency range lower than the pass band B. As a result, in the acoustic wave filter device 1 according to the present preferred embodiment, an adverse influence of the SH wave is exerted to a lesser extent on the filter characteristics. Since no SH wave spurious responses are generated in the pass band B, the filter characteristics are improved.

As described above, in order to set the SH wave response to be located lower than the resonant frequency of the acoustic wave resonator, it is preferable to satisfy the above-described conditions that the IDT electrode 3 includes the main electrode layer made of the material having the density of not smaller than about 18 g/cm³, for example, and that the thickness of the main electrode layer is set to the value at which the acoustic velocity of the SH wave is slower than that of the Rayleigh wave by about 2% or more, for example. When the acoustic velocity of the SH wave is slower than that of the Rayleigh wave by about 2% or more, for example, the SH wave response is lower than the resonance frequency of the Rayleigh wave response by about 2% or more, for example.

A width of the pass band B of the ladder filter is preferably about 4% of a center frequency at maximum, for example. Accordingly, by making the acoustic velocity of the SH wave slower than that of the Rayleigh wave by about 2% or more, for example, as described above, the SH wave response is able to be shifted to a frequency location lower than the center frequency of the pass band by about 2% or more, for example.

Thus, only the thickness of the main electrode layer need to be determined so as to satisfy the above-described relationship in acoustic velocity depending on the type of metal defining the main electrode layer.

This point will be described below with reference to FIGS. 5 to 14.

Figure 5:
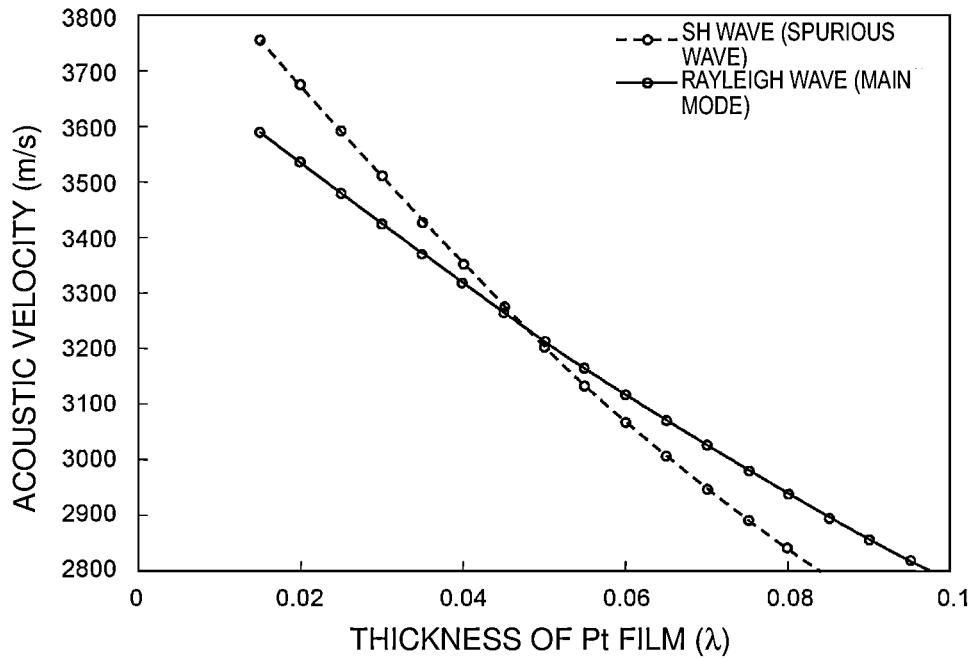
FIG. 5 is a graph representing relationships between a film thickness of a Pt film and an acoustic velocity of each of a Rayleigh wave and an SH wave.
Figure 6:
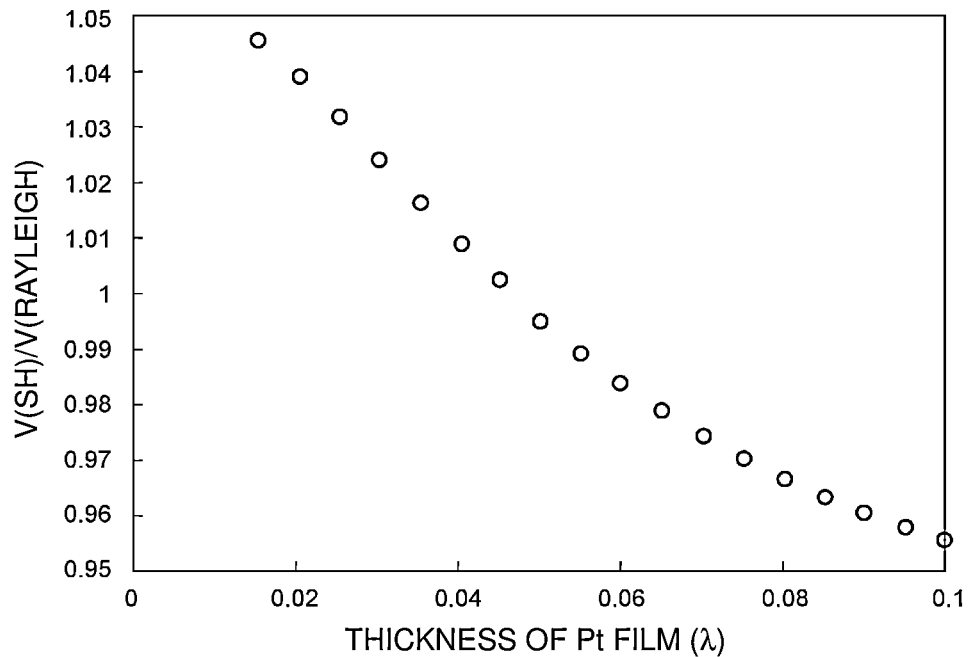
FIG. 6 is a graph representing a relationship between the film thickness of the Pt film and a ratio of the acoustic velocity of the SH wave to the acoustic velocity of the Rayleigh wave.

FIG. 5 is a graph representing relationships between a film thickness of a Pt film and an acoustic velocity of each of a Rayleigh wave and an SH wave when the main electrode layer is made of the Pt film. FIG. 6 is a graph representing a relationship between the film thickness of the Pt film and an acoustic velocity ratio of V(SH)/V(Rayleigh). In this case, it is assumed that the dielectric film is made of SiO₂ and has a thickness of about 0.35λ, for example. As is apparent from FIG. 6, when the film thickness of the Pt film is not smaller than about 0.061λ, for example, the above-mentioned acoustic velocity ratio is not more than about 0.98. In other words, the acoustic velocity of the SH wave is able to be made slower than that of the Rayleigh wave by about 2% or more, for example. Accordingly, when the main electrode layer 12 is made of Pt or the alloy including Pt as the main ingredient, the thickness of the main electrode layer 12 is preferably set to be not smaller than about 0.061λ, for example. More preferably, the film thickness of the main electrode layer made of Pt or the alloy including Pt as the main ingredient is set to be not smaller than about 0.065λ, for example, in order to make the acoustic velocity of the SH wave slower than that of the Rayleigh wave by about 2.5% or more.

The thickness of the main electrode layer is not limited to a particular range from the viewpoint of lowering the acoustic velocity of the SH wave. However, if the thickness of the main electrode layer is too thick, variations in processing are more likely to occur, and variations in frequency would be increased. This would result in reducing a product acceptance rate and increasing a cost. For that reason, the thickness of the main electrode layer is preferably not larger than about 0.20λ, for example. Thus, when the main electrode layer is made of Pt or the alloy including Pt as the main ingredient, the thickness of the main electrode layer is preferably set to fall within the range of not smaller than about 0.061λ and not larger than about 0.20λ, for example.

The following describes similar studies conducted on W, Ta, and Mo each having a comparatively high density.

Figure 7:
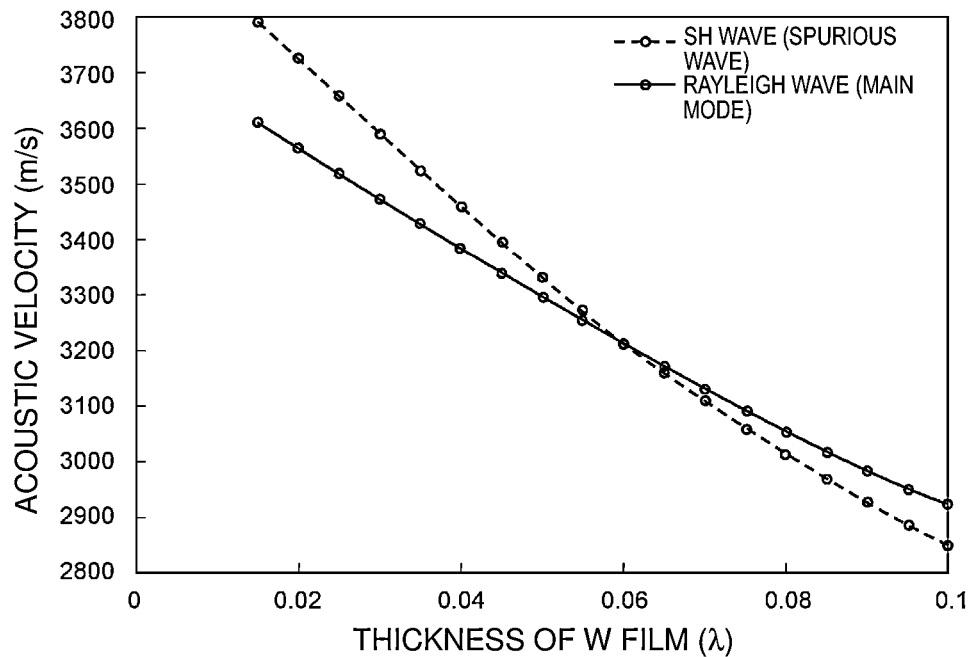
FIG. 7 is a graph representing relationships between a film thickness of a W film and an acoustic velocity of each of a Rayleigh wave and an SH wave.
Figure 8:
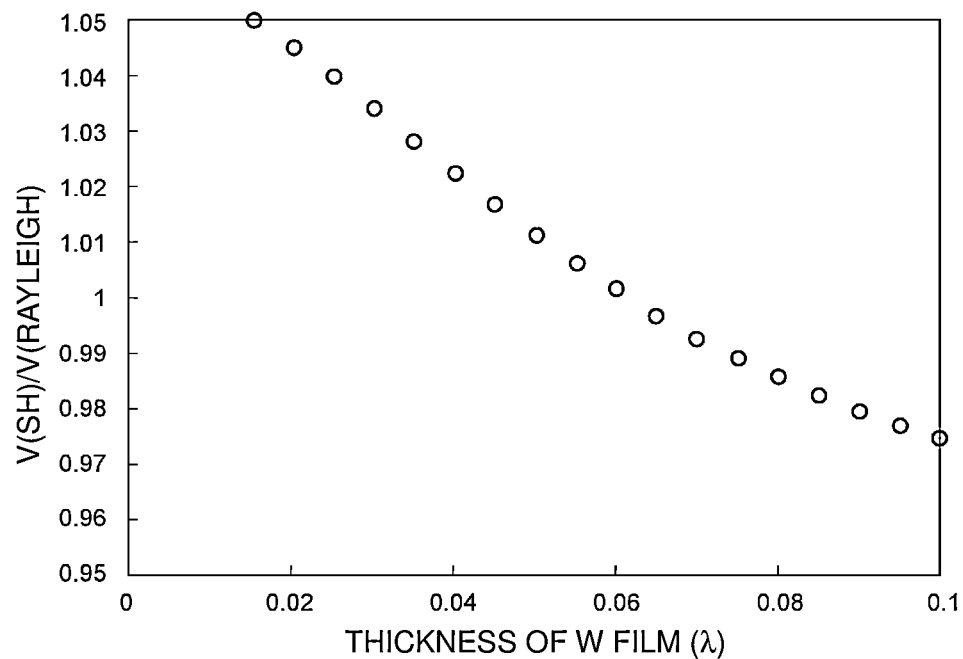
FIG. 8 is a graph representing a relationship between the film thickness of the W film and an acoustic velocity ratio of the acoustic velocity of the SH wave to the acoustic velocity of the Rayleigh wave.

FIGS. 7 and 8 are respectively a graph representing relationships between a film thickness of a W film and an acoustic velocity of each of a Rayleigh wave and an SH wave when the main electrode layer is made of the W film, and a graph representing a relationship between the film thickness of the W film and the acoustic velocity ratio of V(SH)/V(Rayleigh).

When the main electrode layer is made of the W film, the acoustic velocity of the SH wave is slower than that of the Rayleigh wave by about 2% or more when the film thickness is not smaller than about 0.090λ, for example. Accordingly, when the main electrode layer is made of W or the alloy including W as the main ingredient, the film thickness is preferably set to be not smaller than about 0.090λ, for example. More preferably, the film thickness of the main electrode layer made of W or the alloy including W as the main ingredient is set to be not smaller than about 0.10λ, for example, in order to make the acoustic velocity of the SH wave slower than that of the Rayleigh wave by about 2.5% or more.

When the main electrode layer is made of a metal, such as W, other than Pt, an upper limit of the film thickness of the main electrode layer is preferably not larger than about 0.20λ, for example, as in the case of Pt.

Figure 9:
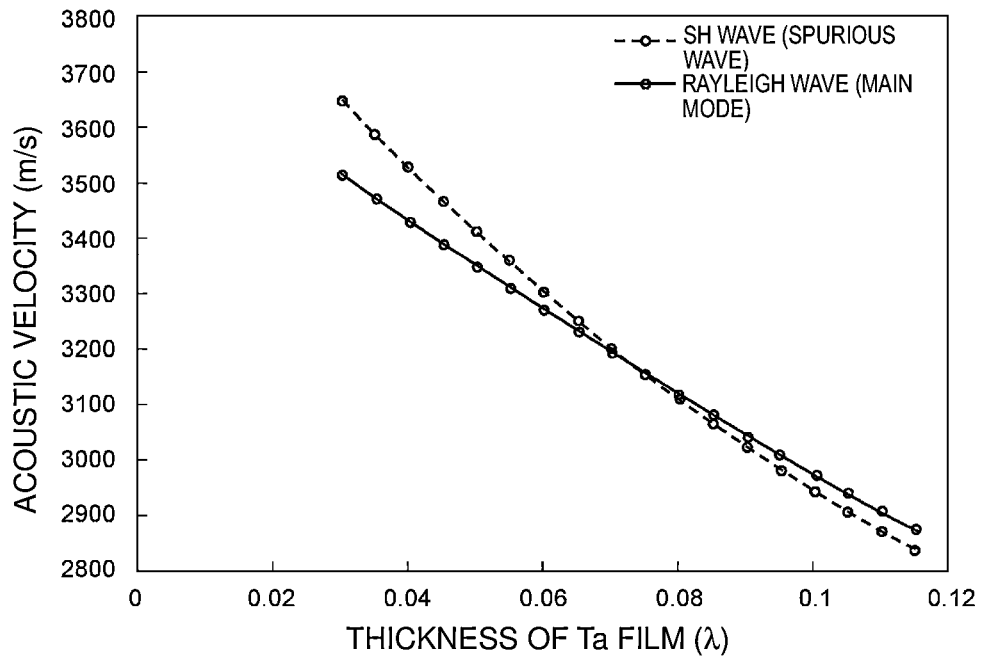
FIG. 9 is a graph representing relationships between a film thickness of a Ta film and an acoustic velocity of each of a Rayleigh wave and an SH wave.
Figure 10:
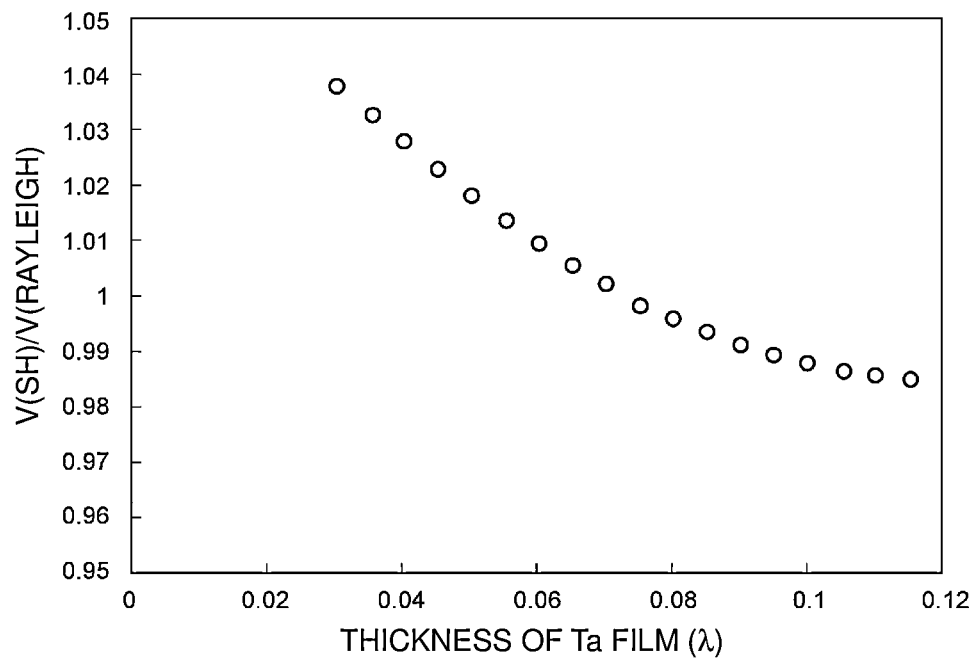
FIG. 10 is a graph representing a relationship between the film thickness of the Ta film and an acoustic velocity ratio of the acoustic velocity of the SH wave to the acoustic velocity of the Rayleigh wave.

FIGS. 9 and 10 are respectively a graph representing relationships between a film thickness of a Ta film and an acoustic velocity of each of a Rayleigh wave and an SH wave when the main electrode layer is made of the Ta film, and a graph representing a relationship between the film thickness of the Ta film and the acoustic velocity ratio of V(SH)/V(Rayleigh). As is apparent from FIG. 10, when the main electrode layer being made of Ta or an alloy including Ta as the main ingredient, the acoustic velocity of the SH wave cannot be made slower than that of the Rayleigh wave by about 2% or more even when the film thickness is increased.

Figure 11:
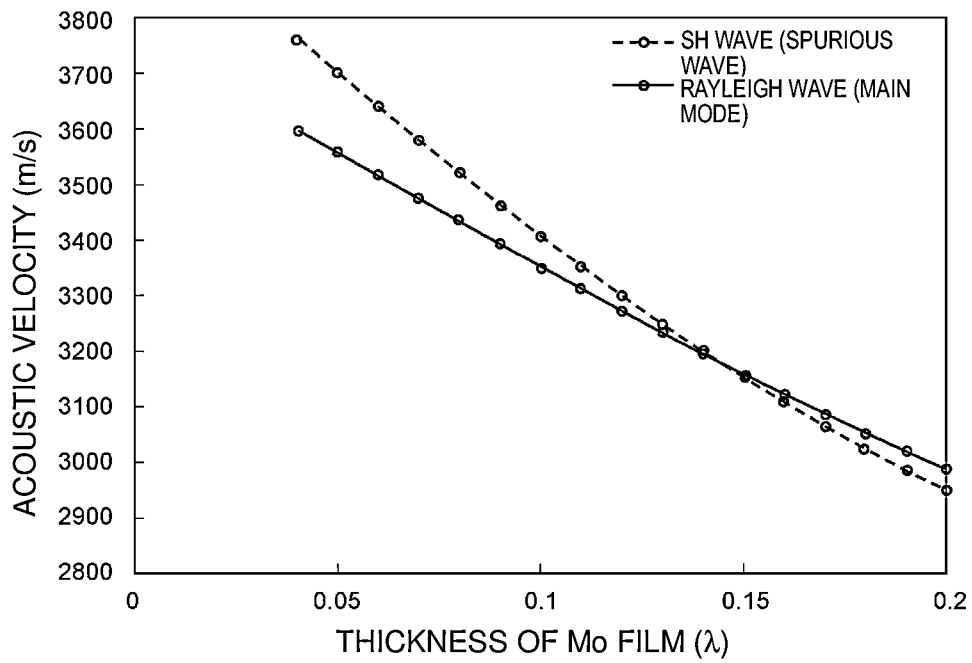
FIG. 11 is a graph representing relationships between a film thickness of a Mo film and an acoustic velocity of each of a Rayleigh wave and an SH wave.
Figure 12:
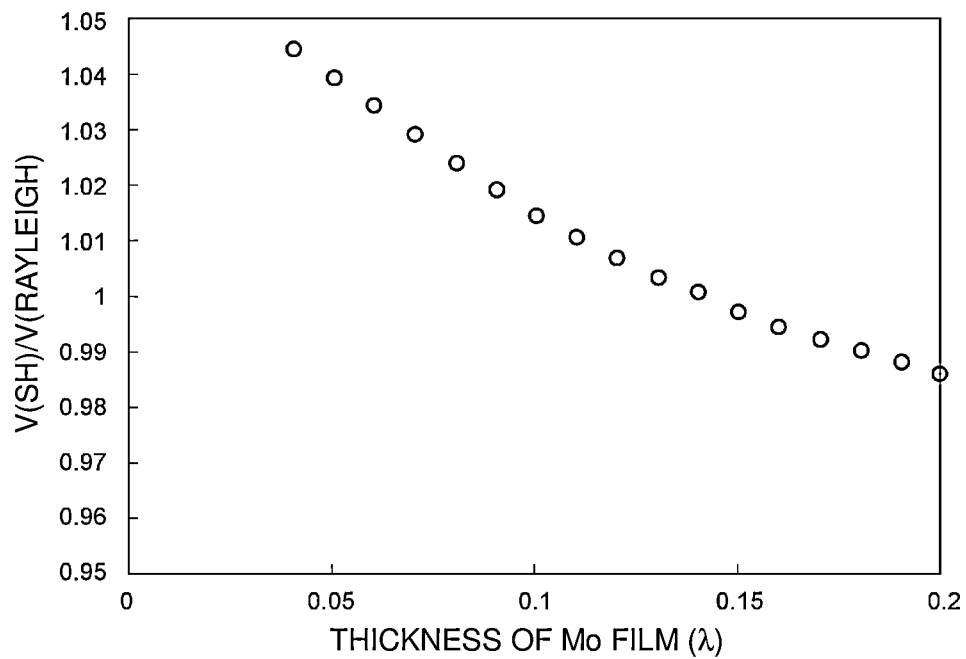
FIG. 12 is a graph representing a relationship between the film thickness of the Mo film and an acoustic velocity ratio of the acoustic velocity of the SH wave to the acoustic velocity of the Rayleigh wave.

FIGS. 11 and 12 are respectively a graph representing relationships between a film thickness of a Mo film and an acoustic velocity of each of a Rayleigh wave and an SH wave when the main electrode layer is made of the Mo film, and a graph representing a relationship between the film thickness of the Mo film and the acoustic velocity ratio of V(SH)/V(Rayleigh).

Also in this case, as in the case of using Ta, the acoustic velocity of the SH wave cannot be made slower than that of the Rayleigh wave by about 2% or more even when the film thickness of Mo is increased.

Figure 13:
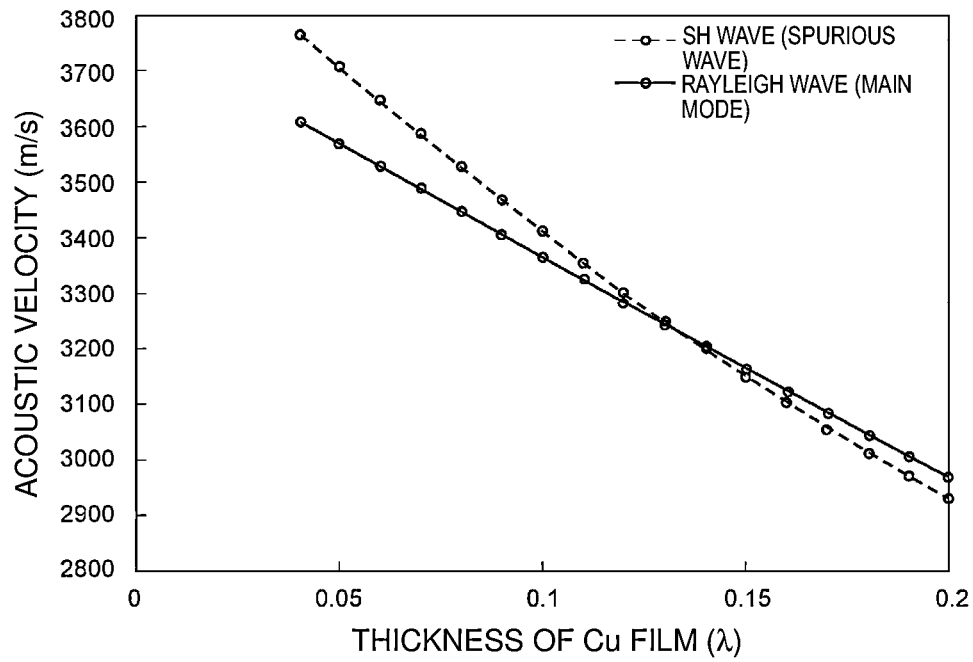
FIG. 13 is a graph representing relationships between a film thickness of a Cu film and an acoustic velocity of each of a Rayleigh wave and an SH wave.
Figure 14:
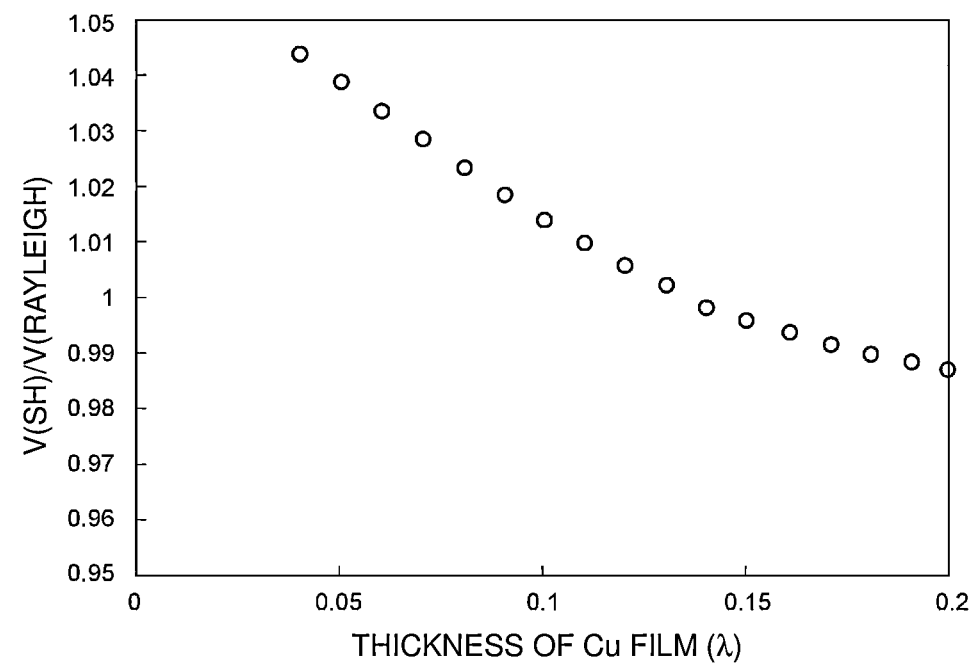
FIG. 14 is a graph representing a relationship between the film thickness of the Cu film and an acoustic velocity ratio of the acoustic velocity of the SH wave to the acoustic velocity of the Rayleigh wave.

FIGS. 13 and 14 are respectively a graph representing relationships between a film thickness of a Cu film and an acoustic velocity of each of a Rayleigh wave and an SH wave when the main electrode layer is made of the Cu film as disclosed in WO2007/125733, and a graph representing a relationship between the film thickness of the Cu film and the acoustic velocity ratio of V(SH)/V(Rayleigh).

Also in this case, as in the case of Mo, the acoustic velocity of the SH wave cannot be made slower than that of the Rayleigh wave by about 2% or more even when the Cu film thickness is increased.

By rechecking, based on the data disclosed in WO2007/125733, the relationships between the film thickness of the Cu film and the acoustic velocity of each of the Rayleigh wave and the SH wave, and the relationship between the film thickness of the Cu film and the acoustic velocity ratio of V(SH)/V(Rayleigh), the inventor of preferred embodiments of the present invention has confirmed that the results illustrated in FIGS. 13 and 14 are obtained.

Thus, it is understood that, in the cases of using Ta, Mo and Cu, an acoustic velocity difference of about 2% or more cannot be obtained even when the film thickness of the electrode is increased. Thus, it is understood that an electrode material needs to be appropriately selected in order to obtain the acoustic velocity difference of about 2% or more.

As described below, from the results of studying in detail the acoustic velocity difference between the Rayleigh wave and the SH wave with respect to the density of the electrode material, it is discovered that the density of not smaller than about 18 g/cm³, for example, is needed in order to obtain the acoustic velocity difference of about 2% or more.

Relationships between electrode materials and density are indicated in Table 1 given below.

TABLE 1

| Materials | Density (g/cm³) |
|---|---|
| Pt | 21.45 |
| W | 19.3 |
| Ta | 16.65 |
| Mo | 10.22 |
| Cu | 8.96 |

As described above, by adjusting the film thickness of the main electrode layer 12 depending on the type of metal defining the main electrode layer 12, it is possible to make the acoustic velocity of the SH wave slower than that of the Rayleigh wave, and thus, to shift the SH wave response to a position outside the pass band of the acoustic wave filter device 1.

In the present preferred embodiment, the SH wave response is shifted to the lower frequency side than the pass band of the acoustic wave filter device 1. The reason that the SH wave response is not shifted to the higher frequency side than the pass band of the acoustic wave filter device 1 is as follows.

Comparing the serial arm resonator and the parallel arm resonator in terms of frequency, the parallel arm resonator is located on the lower frequency side than the serial arm resonator. In attempting to shift the SH wave response to the higher frequency side than the pass band of the acoustic wave filter device 1, therefore, if an SH wave in the parallel arm resonator is able to be shifted to the higher frequency side than the filter pass band, an SH wave in the serial arm resonator is also shifted to the higher frequency side than the filter pass band because the SH wave in the serial arm resonator is located on the higher frequency side than the SH wave in the parallel arm resonator. It is, thus, required to appropriately determine a frequency interval between the anti-resonant frequency and the SH wave response in the parallel arm resonator.

Because the anti-resonant frequency of the parallel arm resonator is designed to be located at a center or approximate center of the filter pass band, the frequency interval between the anti-resonant frequency and the SH wave response in the parallel arm resonator needs to be set to at least half of the filter pass band. A band width of a filter used in cellular phones, or other suitable devices is about 4% of a center frequency at maximum, for example. Thus, the frequency interval between the anti-resonant frequency and the SH wave response in the parallel arm resonator needs to be about 2% or more, for example, of the anti-resonant frequency of the parallel arm resonator.

In this description, FIG. 5 represents the relationship between the resonant frequency of the Rayleigh wave (main mode) and the acoustic velocity of the SH wave (spurious response). Furthermore, the anti-resonant frequency of the Rayleigh wave is present at a location higher than the resonant frequency of the Rayleigh wave by about 3% to about 4%, for example.

Assuming, for example, that the main electrode layer in the parallel arm resonator is made of Pt and the thickness of the main electrode layer in the parallel arm resonator is about 0.02λ, the frequency of the SH wave generated in the parallel arm resonator is equal or substantially equal to the anti-resonant frequency of the Rayleigh wave. In order to shift the SH wave generated in the parallel arm resonator to the higher frequency side than the filter pass band in the above case, the Pt film thickness needs to be smaller than about 0.02λ because the frequency of the SH wave in the parallel arm resonator needs to be higher than the anti-resonant frequency of the parallel arm resonator by about 2% or more. In order to increase the SH wave in the parallel arm resonator by about 2%, however, the Pt film thickness needs to be smaller than about 0.01λ, thus causing various problems, such as deficiency of reflectance at the electrode fingers.

Accordingly, a difficulty arises in shifting the SH wave response to the higher frequency side than the filter pass band, and it is preferable to shift the SH wave response to the lower frequency side as in this application.

Euler Angles of the piezoelectric substrate made of LiNbO₃ are preferably set to (0°±within range of about 5°, θ, 0°±within range of about 10°) wherein θ is in a range of not smaller than about 20° and not larger than about 50°, for example. In this case, the Rayleigh wave is able to be efficiently excited as disclosed in WO2007/125733.

In the above-described preferred embodiment, the acoustic wave filter device 1 defining a ladder filter is described, and both of the serial arm resonator and the parallel arm resonator in the acoustic wave filter device 1 are preferably defined by the acoustic wave resonators. However, it is only required that the main electrode layer in at least the serial arm resonator of the ladder filter is made of Pt or the alloy including Pt as the main ingredient, or made of W or the alloy including W as the main ingredient, and that the thickness of the main electrode layer is set to the value at which the acoustic velocity of the SH wave generated in the serial arm resonator is slower than that of the Rayleigh wave by about 2% or more, for example.

For instance, when the main electrode layer of the serial arm resonator is made of Pt or the alloy including Pt as the main ingredient, the thickness of the main electrode layer in the serial arm resonator needs to fall in the range of not smaller than about 0.061λ and not larger than about 0.20λ, for example, as a minimum condition. When the main electrode layer of the serial arm resonator is made of W or the alloy including W as the main ingredient, the thickness of the main electrode layer in the serial arm resonator needs to fall in the range of not smaller than about 0.090λ and not larger than about 0.20λ, for example, as a minimum condition.

In the case above, the SH wave response generated in the serial arm resonator is able to be shifted to a position on the lower frequency side far away from the resonant frequency of the serial arm resonator, and therefore, the SH wave response is able be located on the lower frequency side than the pass band of the acoustic wave filter device 1 that is the ladder filter.

The reason for this is as follows. Comparing the serial arm resonator and the parallel arm resonator in the ladder filter in terms of frequency, the serial arm resonator is located on the higher frequency side than the parallel arm resonator. Therefore, if the SH wave generated in the serial arm resonator is able to be shifted to the lower frequency side than the filter pass band, the SH wave generated in the parallel arm resonator is also shifted away from the filter pass band because it is on the lower frequency side than the SH wave generated in the serial arm resonator.

In the ladder filter, because the resonant frequency of the serial arm resonator is generally designed to be located at the center or approximate center of the filter pass band, a frequency interval between the resonant frequency and the SH wave response in the serial arm resonator needs to be about half or more of the filter pass band. A band width of a filter used in cellular phones, or other suitable devices, is, for example, about 4% of a center frequency at maximum. Thus, the frequency interval between the resonant frequency and the SH wave response in the serial arm resonator needs to be about 2% or more, for example, of the resonant frequency of the serial arm resonator.

In the case of the main electrode layer of the serial arm resonator being made of Pt or the alloy including Pt as the main ingredient, by setting the thickness of the main electrode layer in the serial arm resonator to be not smaller than about 0.061λ, for example, the interval between the resonant frequency of the serial arm resonator and the frequency of the SH wave generated in the serial arm resonator is able be increased by about 2% or more of the resonant frequency, and thus, the SH wave response is able to be shifted to the lower frequency side than the filter pass band. In the case of the main electrode layer of the serial arm resonator being made of W or the alloy including W as the main ingredient, by setting the thickness of the main electrode layer in the serial arm resonator to be not smaller than about 0.090λ, for example, the frequency interval between the resonant frequency and the SH wave generated in the serial arm resonator is able to be increased by about 2% or more of the resonant frequency, and thus, the SH wave response is able to be shifted to the lower frequency side than the filter pass band.

When there are a plurality of serial arm resonators, at least one of those serial arm resonators needs to satisfy the condition that the frequency interval between the resonant frequency and the SH wave response in the relevant serial arm resonator is about 2% or more of the resonant frequency of the relevant serial arm resonator. More preferably, in each of those serial arm resonators, the frequency interval between the resonant frequency and the SH wave response in the serial arm resonator is about 2% or more of the resonant frequency of the serial arm resonator.

Figure 15:
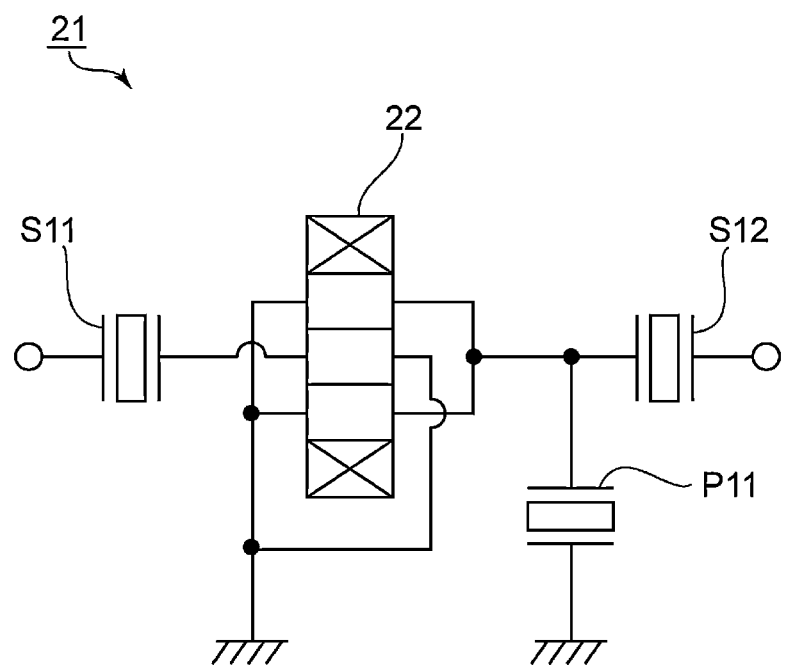
FIG. 15 is a circuit diagram of an acoustic wave filter device according to another preferred embodiment of the present invention.

Bandpass acoustic wave filter devices according to preferred embodiments of the present invention are not limited to the ladder filters described above. For instance, the present invention may be applied to a cascaded-resonator acoustic wave filter 22 in an acoustic wave filter device 21, illustrated in FIG. 15, according to another preferred embodiment. In this preferred embodiment, an acoustic wave resonator S11 defining a series-connected trap is connected to the input terminal side of the cascaded-resonator acoustic wave filter 22. Furthermore, an acoustic wave resonator S12 defining a series-connected trap is connected to the output terminal side of the cascaded-resonator acoustic wave filter 22. An acoustic wave resonator P11 is connected between the ground potential and a junction point that is located between the cascaded-resonator acoustic wave filter 22 and the acoustic wave resonator S12. As in the case of the first preferred embodiment, the acoustic wave resonators S11 and S12 are required as a minimum condition to be structured such that the SH wave response in at least one of the acoustic wave resonators S11 and S12 appears on the lower frequency side than the pass band of the acoustic wave filter device 21.

More specifically, as a minimum condition, the thickness of the main electrode layer in the acoustic wave resonator S11 or/and S12 defining the series-connected trap is preferably set to a value at which the acoustic velocity of the SH wave is slower than that of the Rayleigh wave by about 2% or more.

For instance, when the main electrode layer in the acoustic wave resonator S11 or/and S12 is made of Pt or the alloy including Pt as the main ingredient, the thickness of the main electrode layer in the relevant acoustic wave resonator, as a minimum condition, preferably falls in the range of not smaller than about 0.061λ and not larger than about 0.20λ, for example. When the main electrode layer in the relevant acoustic wave resonator is made of W or the alloy including W as the main ingredient, the thickness of the main electrode layer in the relevant acoustic wave resonator S11, as a minimum condition, preferably falls in the range of not smaller than about 0.090λ and not larger than about 0.20λ, for example.

Additionally, preferred embodiments of the present invention may also be applied to a duplexer including the acoustic wave filter device 1 or the acoustic wave filter device 21.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a cascaded-resonator acoustic wave filter; and
   an acoustic wave resonator that is disposed on an input terminal side or an output terminal side of the cascaded-resonator acoustic wave filter, and that defines a series-connected trap;
   wherein
   the acoustic wave resonator includes:
      a piezoelectric substrate including a $LiNbO_3$ layer,
      an IDT electrode disposed on the $LiNbO_3$ layer, and
      a dielectric film disposed on the piezoelectric substrate and covering a top surface of the IDT electrode;
   a main electrode layer of the IDT electrode is made of Pt, an alloy including Pt, W, or an alloy including W;
   the acoustic wave resonator utilizes a Rayleigh wave; and
   the piezoelectric substrate has Euler Angles (0°±about 5°, θ, 0°±about 10°), θ being not smaller than about 20° and not larger than about 50°.

2. The acoustic wave filter device according to claim 1, wherein a thickness of the main electrode layer is not smaller than about 0.090λ.

3. The acoustic wave filter device according to claim 1, wherein the material of the IDT electrode has a density of not smaller than about 18 g/cm$^3$.

4. An acoustic wave filter device comprising:
a cascaded-resonator acoustic wave filter; and
an acoustic wave resonator that is disposed on an input terminal side or an output terminal side of the cascaded-resonator acoustic wave filter, and that defines a series-connected trap;
wherein
the acoustic wave resonator includes:
a piezoelectric substrate including a LiNbO$_3$ layer,
an IDT electrode disposed on the LiNbO$_3$ layer, and
a dielectric film disposed on the piezoelectric substrate and covering a top surface of the IDT electrode;
a main electrode layer of the IDT electrode is made of Pt, an alloy including Pt, W, or an alloy including W;
the acoustic wave resonator utilizes a Rayleigh wave; and
a thickness of the main electrode layer has a value at which an acoustic velocity of an SH wave is slower than an acoustic velocity of the Rayleigh wave by about 2% or more.

5. A acoustic wave filter device comprising:
an acoustic wave resonator that is connected in series between an input terminal and an output terminal;
wherein
the acoustic wave resonator includes:
a piezoelectric substrate including a LiNbO$_3$ layer,
an IDT electrode disposed on the LiNbO$_3$ layer, and
a dielectric film disposed on the piezoelectric substrate and covering a top surface of the IDT electrode;
a main electrode layer of the IDT electrode is made of Pt, an alloy including Pt, W, or an alloy including W;
the acoustic wave resonator utilizes a Rayleigh wave; and
the piezoelectric substrate has Euler Angles (0°±about 5°, θ, 0°±about 10°), θ being not smaller than about 20° and not larger than about 50°.

6. The acoustic wave filter device according to claim 5, wherein a thickness of the main electrode layer has a value at which an acoustic velocity of an SH wave is slower than an acoustic velocity of the Rayleigh wave by about 2% or more.

7. The acoustic wave filter device according to claim 5, wherein a thickness of the main electrode layer is not smaller than about 0.090λ.

8. The acoustic wave filter device according to claim 5, wherein the material of the IDT electrode has a density of not smaller than about 18 g/cm$^3$.

* * * * *